United States Patent
Clevenger et al.

(10) Patent No.: US 6,777,761 B2
(45) Date of Patent: Aug. 17, 2004

(54) SEMICONDUCTOR CHIP USING BOTH POLYSILICON AND METAL GATE DEVICES

(75) Inventors: Lawrence A. Clevenger, LaGrangeville, NY (US); Louis L. Hsu, Fishkill, NY (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/214,084

(22) Filed: Aug. 6, 2002

(65) Prior Publication Data

US 2004/0026734 A1 Feb. 12, 2004

(51) Int. Cl.[7] .............................................. H01L 29/76
(52) U.S. Cl. ........................ 257/388; 257/412; 257/413
(58) Field of Search ................................ 257/351, 369, 257/388, 754

(56) References Cited

U.S. PATENT DOCUMENTS 6,124,189 A * 9/2000 Watanabe et al.
6,140,688 A * 10/2000 Gardner et al.
6,303,418 B1 10/2001 Cha et al.

OTHER PUBLICATIONS

Tadahiro Ohmi et al., "New Paradigm of Silicon Technology", Proceedings of the IEEE, vol. 89, No. 3, Mar. 2001, pp. 394–412.

* cited by examiner

Primary Examiner—Fetsum Abraham
(74) Attorney, Agent, or Firm—McGinn & Gibb, PLLC; Wan Yee Cheung, Esq.

(57) ABSTRACT

A semiconductor structure (and method for forming) having transistors having both metal gates and polysilicon gates on a single substrate in a single process is disclosed. The method forms a gate dielectric layer on the substrate and forms the metal seed layer on the gate oxide layer. The method patterns the metal seed layer to leave metal seed material in metal gate seed areas above the substrate. Next, the method patterns a polysilicon layer into polysilicon structures above the substrate. Some of the polysilicon structures comprise sacrificial polysilicon structures on the metal gate seed areas and the remaining ones of the polysilicon structures comprise the polysilicon gates. The patterning of the polysilicon gates forms the sacrificial gates above all the metal gate seed areas. Following that, the invention forms sidewall spacers, and source and drain regions adjacent the polysilicon structures. Then, the invention protects the polysilicon gates, removes the sacrificial polysilicon structures, and plates the metal gate seed areas to form the metal gates. The sidewall spacers self-align the metal gates. The plating process forms the metal gates of pure metal. All thermal processing that raises the temperature above a damage threshold for the metal is performed before the plating process.

22 Claims, 8 Drawing Sheets

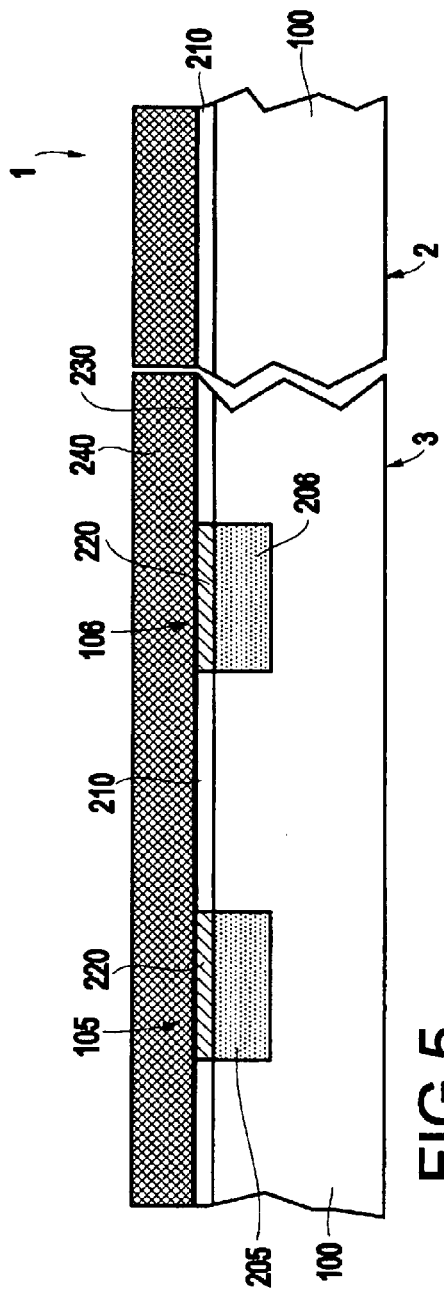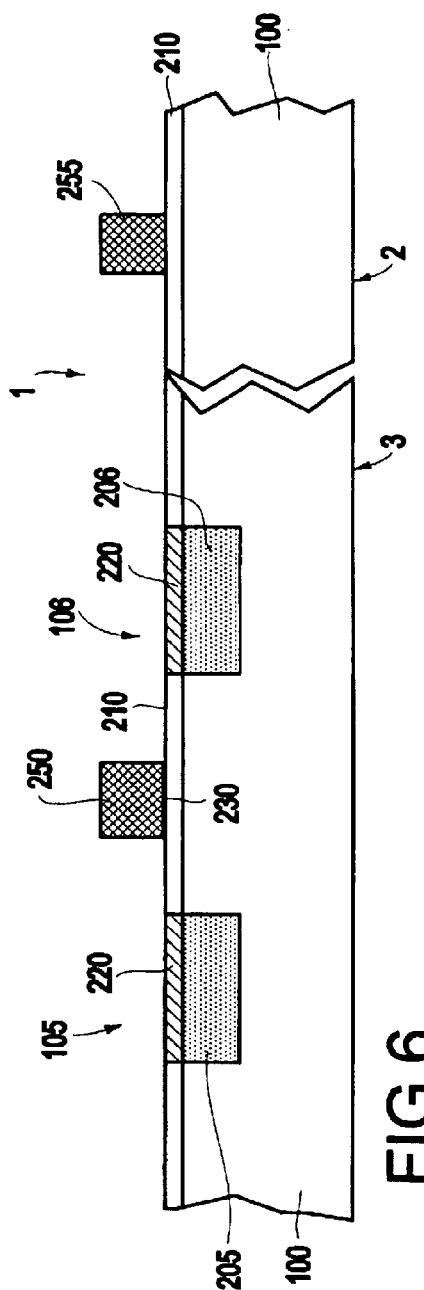

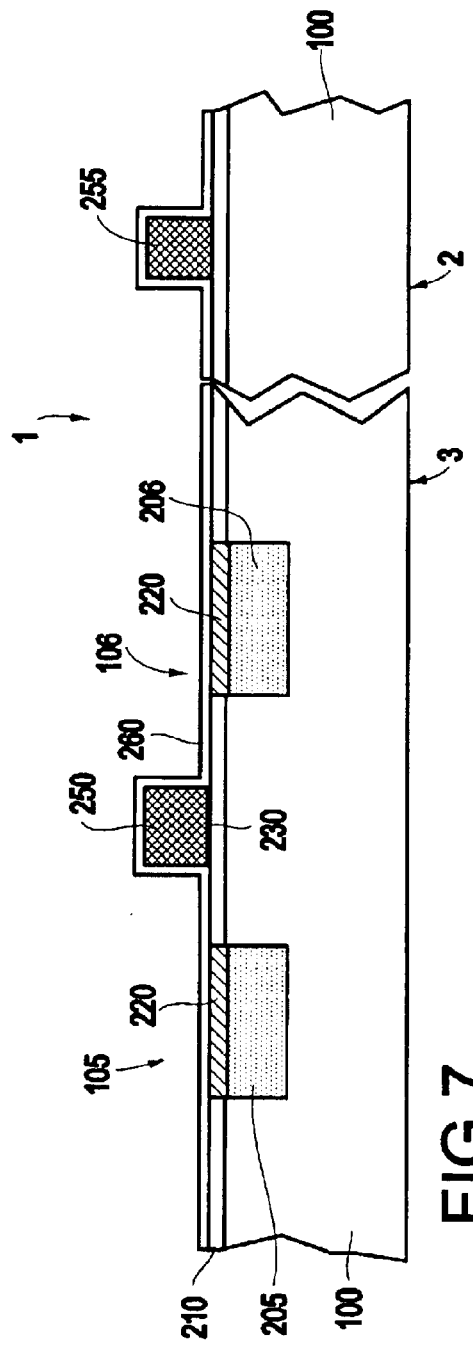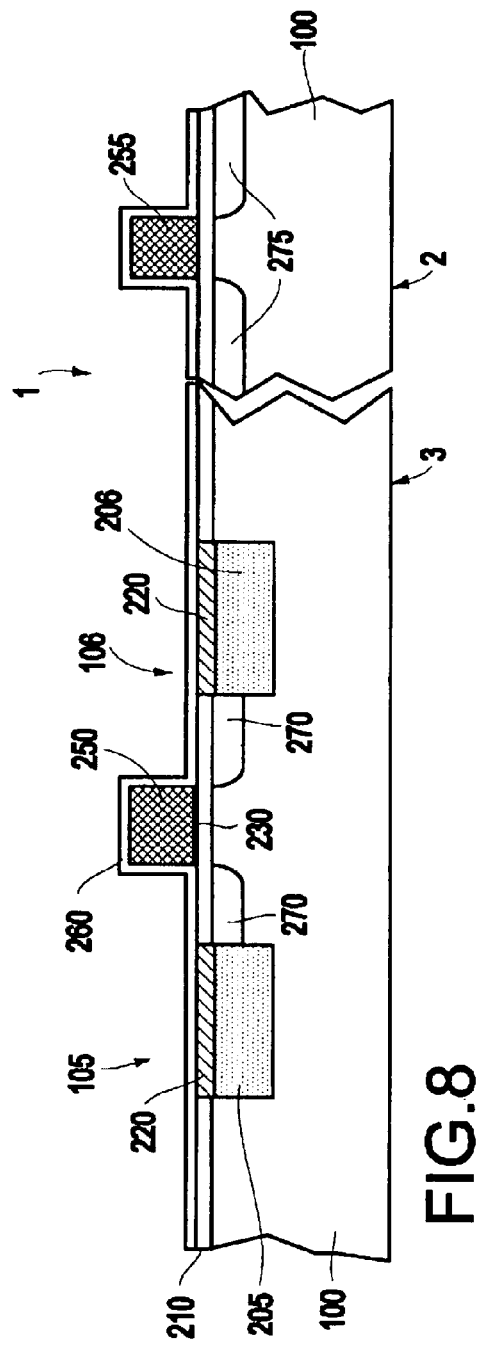

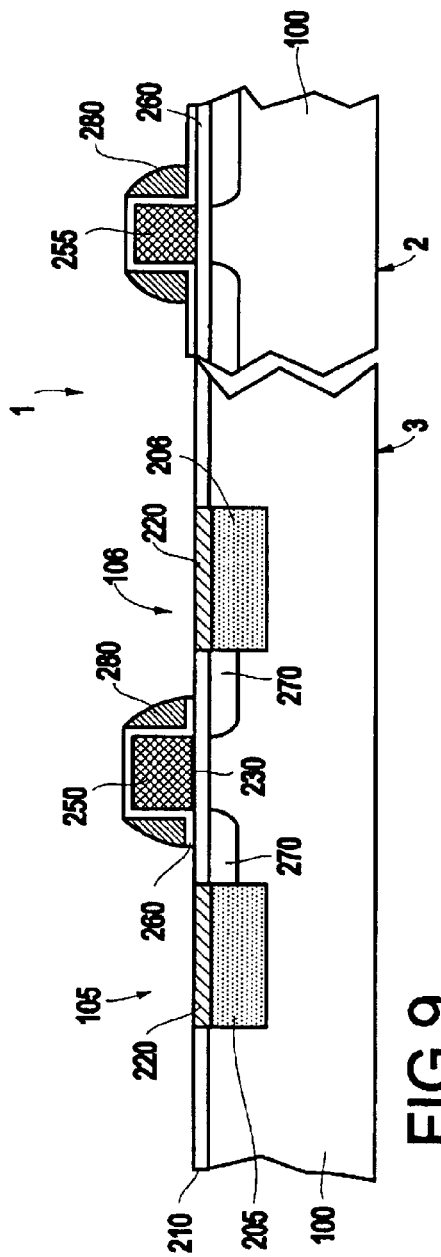
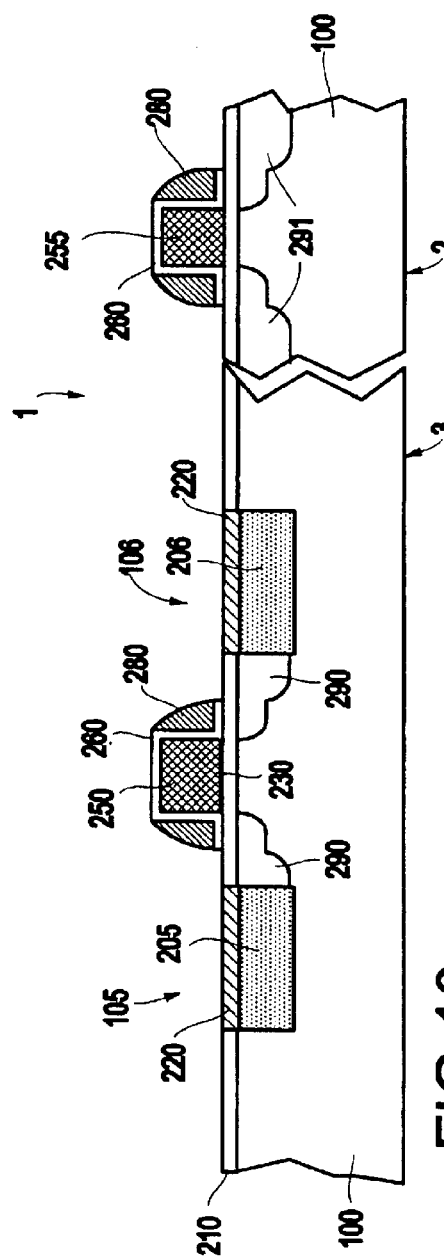

SEMICONDUCTOR CHIP USING BOTH POLYSILICON AND METAL GATE DEVICES

BACKGROUND OF THE INVENTION

1. Field of the Invention

The present invention generally relates to integrated circuit devices, and more particularly to a semiconductor chip and a complementary metal oxide semiconductor (CMOS) device having a both pure polysilicon and pure metal gates.

2. Description of the Related Art

Polysilicon is the standard gate material used for CMOS devices. The technology of fabricating CMOS devices using polysilicon gates has been in a constant state of development, and is now widely used in the semiconductor industry. Advantages of using polysilicon gates are that they can sustain high temperatures. Further, with the invention, the source/drain and gate can be doped and then silicided simultaneously in a self-aligned manner. Also, the mid-gap work function for a AMOS and n-MOS can be achieved, with the invention.

However, there are also some problems associated with using a polysilicon gate. For example, due to the poly-depletion effect and relative high electrical sheet resistance (approximately 150 Ohms/Sq.), dual poly-gates commonly used in CMOS devices are becoming a gating factor in chip performance for channel lengths of 0.1 micron and below. Another problem with poly gates is that the dopant in the poly-gate, such as boron, can easily diffuse through the thin gate dielectric causing further degradation of the device performance.

In the past, it has been a great challenge to form metal gates for CMOS devices in a dual metal gate structure because the integration process steps are complex and the processing costs are high. Conventional approaches of using tungsten to form the mid-gap metal gates for PFETs and NFETs have resulted in simpler processes. However, these approaches have failed to achieve the needed small threshold voltage. While counter doping the substrate and well can offset this requirement, doing so will negatively affect the short-channel characteristic of the device. An interim solution is taught in U.S. Pat. No. 6,049,114, "Semiconductor Device Having a Metal Containing Layer Overlaying a Gate Dielectric," the complete disclosure of which is herein incorporated by reference, which discloses using layers of metal silicide to control the work function and to provide a lower resistance gate contact.

Some conventional solutions suggest using molybdenum as the gate metal and using a nitrogen ion-implant to tailor its work function, as described in "New Paradigm of Silicon Technology", Tadahiro Ohmi, et al., Proceedings of the IEEE, Vol. 89, No. 3, March 2001, pp. 394–412, the complete disclosure of which is herein incorporated by reference. Furthermore, a technique disclosed in "Dual-Metal Gate CMOS Technology with Ultrathin Silicon Nitride Gate Dielectric", Yee-Chia Yeo, et al., IEE Electron Device Letters, Vol. 22, No. 5, May 2001, pp 227–229, the complete disclosure of which is herein incorporated by reference, teach how to make a low work function compound by co-evaporating silicon and alkali metal in an oxygen environment.

There are also some conventional methods that teach selectively plating a metal gate electrode. For example, one method for selectively plating a metallic film on a dielectric layer is disclosed in U.S. Pat. No. 3,011,920, "Method of Electroless Deposition on a Substrate and Catalyst Solution Therefore", the complete disclosure of which is herein incorporated by reference, which teaches sensitizing the substrate with a solution of a colloidal metal, accelerating the treatment with a selective solvent to remove protective colloids for the sensitized dielectric substrate, and then electrolessly depositing a metal coating on the sensitized substrate.

Also, other methods suggested in U.S. Pat. No. 3,099,608, "Method of Electroplating on a Dielectric Base;" U.S. Pat. No. 4,569,743, "Method and Apparatus for the Elective, Self-Aligned Deposition of Metal Layers;" and U.S. Pat. No. 6,153,935, "Dual Etch Stop/Diffusion Barrier for Damascene Interconnections," the complete disclosures of which are herein incorporated by reference, disclose that a dielectric layer can be pretreated by depositing a thin film conductive-type metal such as palladium, rhodium, ruthenium, molybdenum, indium, tin, or aluminum to provide a conducting base which permits electroplating with a conductive metal such as copper, gold, chromium, silver, cobalt, or nickel on the conductive base. As taught in U.S. Pat. No. 6,153,935, in certain cases, a diffusion barrier can be deposited after the conducting base and the conductive metal in order to prevent interactions between the conductive base and the conductive metal. Typical conductive metal diffusion barriers include Ni—P, Co—P, Ni—B, Co—B, Pd, Co(W)P, and Co(W)B. These diffusion barriers have excellent diffusion barrier properties and excellent adhesion to dielectric materials.

However, none of the prior art solutions teach a method of forming both pure polysilicon and pure metal gates on the same chip. Moreover, none of the prior art techniques provide a solution where one part of the chip can use a reliable, high-yield polysilicon gate, while the other part of the chip can use a high-performance, short channel metal gate.

SUMMARY OF THE INVENTION

In view of the foregoing and other problems, disadvantages, and drawbacks of the conventional semiconductor integration processes the present invention has been devised, and it is an object of the present invention to provide a structure and method for a semiconductor chip that has both pure polysilicon and pure metal gate devices. It is another object of the present invention to provide a simple processing procedure to co-process polysilicon and metal gate devices on the same chip. Another object of the present invention is to share multiple processing steps when forming such devices using two different gate materials. Yet another object of the present invention is to provide a self-aligned, high-resolution, selective metal plating technique to form a metal gate after completion of the high-temperature processing steps. Still another object of the present invention is to provide a method of forming both a polysilicon gate and metal gate on the same integrated circuit chip. It is another object of the present invention to provide a solution where one part of the chip can use a reliable, high-yield polysilicon gate, while the other part of the chip can use a high-performance, short channel metal gate.

In order to attain the objects suggested above, there is provided, according to one aspect of the invention, a method of forming semiconductor transistors having both metal gates and polysilicon gates on a single substrate in a single process. The method forms a gate dielectric layer on the substrate and forms the metal seed layer on the gate oxide layer. The method patterns the metal seed layer to leave metal seed material in metal gate seed areas above the substrate. Next, the method patterns a polysilicon layer into polysilicon structures above the substrate.

Some of the polysilicon structures comprise sacrificial polysilicon structures on the metal gate seed areas and the remaining ones of the polysilicon structures comprise the polysilicon gates. The patterning of the polysilicon gates forms the sacrificial gates above all the metal gate seed areas. Following that, the invention forms sidewall spacers, and source and drain regions adjacent the polysilicon structures. Then, the invention protects the polysilicon gates, removes the sacrificial polysilicon structures, and plates the metal gate seed areas to form the metal gates. The sidewall spacers self-align the metal gates. The plating process forms the metal gates of pure metal. All thermal processing that raises the temperature above a damage threshold for the metal is performed before the plating process.

This process produces a structure having a substrate having a first region and a second region, a metal gate transistor in the first region (the metal gate transistor having a pure metal gate) and a polysilicon gate transistor in the second region (the polysilicon gate transistor having a polysilicon gate). The metal gate transistor comprises an oxide layer above the substrate, a metal seed layer above the first oxide layer, and the pure metal gate above the metal seed layer. The pure metal gate comprises one of copper, gold, chromium, silver, cobalt, and nickel. The metal seed layer comprises metals in the class of ruthenium. The polysilicon gate transistor comprises an oxide layer above the substrate and a polysilicon gate above the oxide layer.

Thus, according to the present invention, polysilicon gate devices are formed in areas where reliability is more important than the performance and, in the same manufacturing process, metal gates are formed in areas where performance is paramount. An example of an area where reliability is most important is an embedded system containing a CPU macro and a memory macro. Here, it is important that the memory macro should have a high reliability in terms of yield, leakage level, radiation effect, etc. For example, the transfer gate of a DRAM cell has a polysilicon gate to ensure a low leakage current, so that retention time of the cell will meet design specifications. On the other hand, the CPU circuits could enjoy high-performance by using very short channel metal gates operated at low voltage. Thus, according to the present invention, a set of processing steps is disclosed which minimizes the process complexity and results in an overall lower processing cost compared with conventional techniques.

There are several benefits of the present invention. For example, the present invention provides a simple processing procedure to co-process polysilicon and metal gate devices on the same chip. The present invention also provides the ability to share multiple processing steps when forming such devices using two different gate materials. The present invention provides a self-aligned, high-resolution, selective metal plating technique to form a metal gate upon completion of the high-temperature processing steps. Thus, the present invention provides a solution where one part of the chip can use a reliable, high-yield polysilicon gate, while the other part of the chip can use a high-performance, short channel metal gate.

BRIEF DESCRIPTION OF THE DRAWINGS

The foregoing and other objects, aspects and advantages will be better understood from the following detailed description of a preferred embodiment of the invention with reference to the drawings, in which:

FIG. 5 is a schematic diagram of a partially completed semiconductor device;

FIG. 6 is a schematic diagram of a partially completed semiconductor device;

FIG. 7 is a schematic diagram of a partially completed semiconductor device;

FIG. 8 is a schematic diagram of a partially completed semiconductor device;

FIG. 9 is a schematic diagram of a partially completed semiconductor device;

FIG. 10 is a schematic diagram of a partially completed semiconductor device;

DETAILED DESCRIPTION OF PREFERRED EMBODIMENTS OF THE INVENTION

According to the present invention, conventional problems are resolved by replacing some of the polysilicon gates with low sheet resistance metal gates. The invention uses specific materials to achieve proper work functions. For example, Ni, TaN, RuO, MoN metal gates are more compatible with P-type doped polysilicon, and Ru Ta TaSi metal gates are more compatible with N-type doped polysilicon.

Thus, according to the present invention, a pure polysilicon gate device is formed in an area where reliability is more important than the performance. Furthermore, according to the present invention, a set of processing steps is utilized that minimizes the process complexity and results in an overall lower processing cost compared with conventional techniques.

Figure 1:
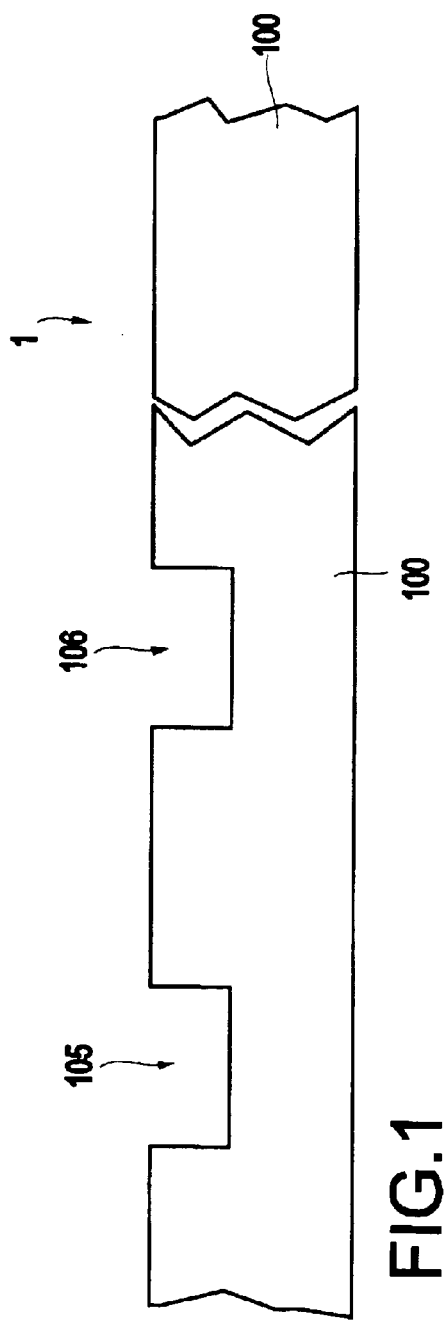
FIG. 1 is a schematic diagram of a partially completed semiconductor device.

Referring now to the drawings, and more particularly to FIGS. 1 through 15, there are shown preferred embodiments of a semiconductor device 1, and the method of forming the same, according to the present invention. Specifically, as shown in FIG. 1, a shallow trench patterning is performed on a semiconductor substrate 100. The shallow trench patterning results in patterned regions 105, 106.

Figure 2:
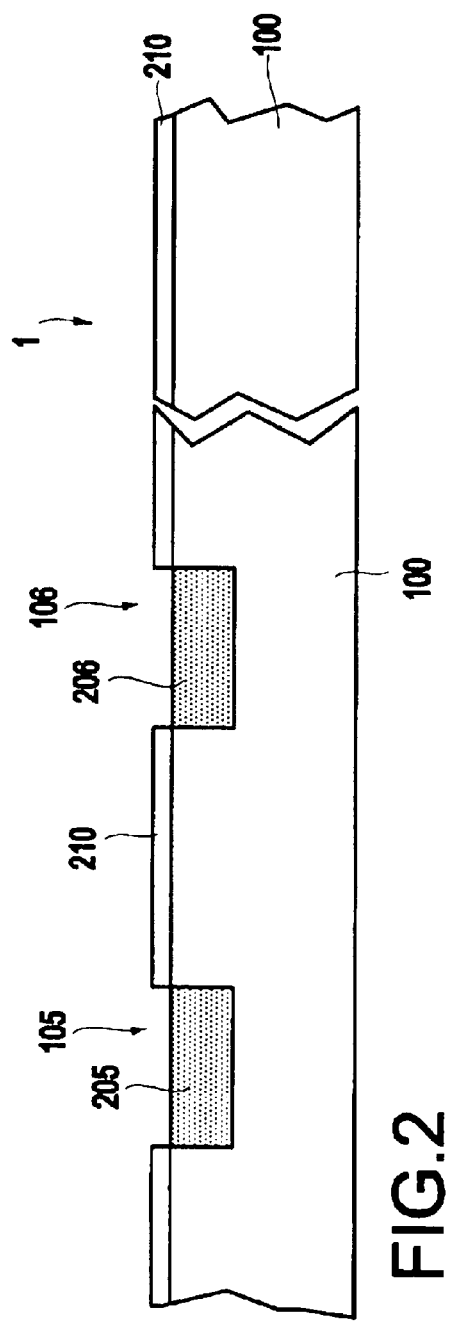
FIG. 2 is a schematic diagram of a partially completed semiconductor device.

Next, FIG. 2 illustrates the device 1 after the etched shallow patterned trenches 105, 106 are filled with a dielectric material 205, 206, respectively, such as CVD oxide. Next, a chemical-mechanical polish process as well as an etching process are performed to slightly recess the oxide level 205 and 206. After a subsequent cleaning step, a thin layer of thermal oxide 210 is grown on the exposed silicon surface 100.

Figure 3:
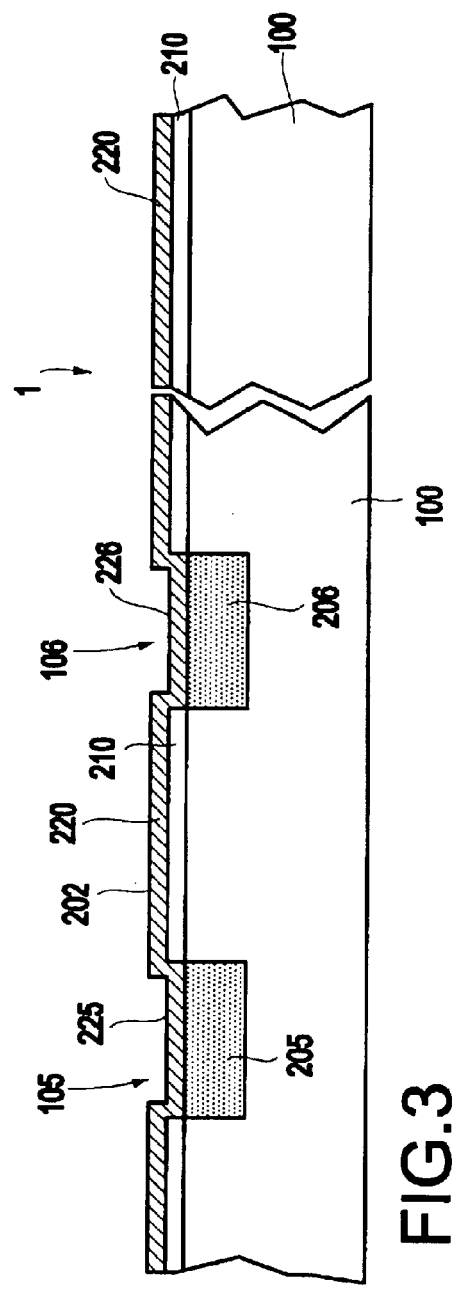
FIG. 3 is a schematic diagram of a partially completed semiconductor device.

In FIG. 3, it is shown that a layer of CVD nitride 220 is deposited on the thermal oxide 210 and the dielectric material 205, 206. As shown in FIG. 3, the upper surface 225, 226 of the nitride layer 220 in the shallow trench region 105, 106 is below the upper surface 202 of the same nitride layer 220 outside the shallow trench regions 105, 106.

Figure 4:
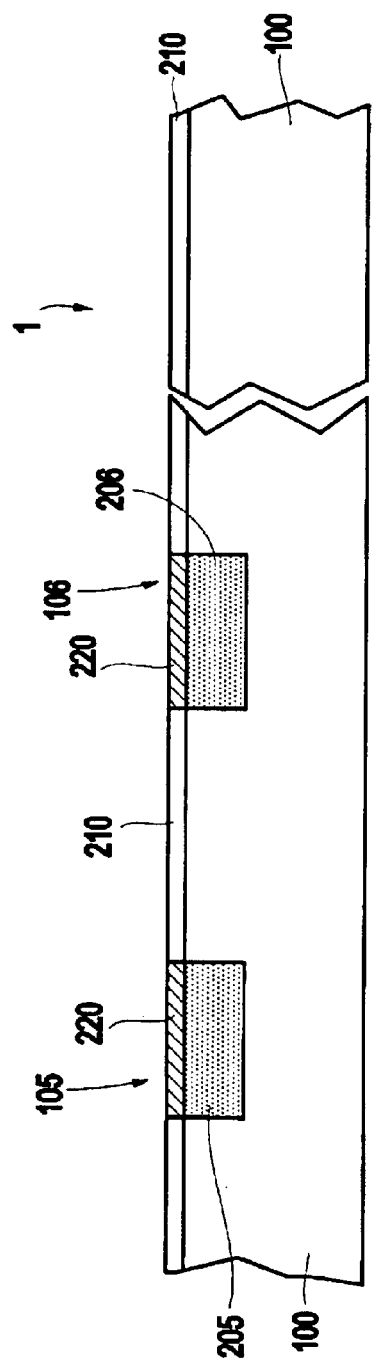
FIG. 4 is a schematic diagram of a partially completed semiconductor device.

Next, FIG. 4 shows the device 1 after undergoing another chemical-mechanical polish step in order to remove the nitride layer 220 outside of the shallow trench regions 105, 106. This process leaves the nitride film 220 only within the shallow trench regions 105, 106.

As seen in FIG. 5, a metal seeding layer 230 such as ruthenium, or any other similar class of metals, etc., is deposited on top of the device 1. The metal seeding layer 230 is patterned so that it is removed from areas where polysilicon gates will be formed 2 and remains in areas where metal gates are formed 3. Then, a CVD polysilicon layer 240 is deposited above the metal seeding layer 230. Portions of the polysilicon layer 240 that are in the polysilicon gate regions 2 are protected with a nitride mask. The unprotected portions of the polysilicon layer 240 (e.g., in the metal gate regions 3) are oxidized.

FIG. 6 illustrates the structure after a patterning process is carried out in order to form a polysilicon gate 255 in the polysilicon gate region 2, and a dummy gate 250 (oxidized polysilicon) in the metal gate region 3. This patterning process includes an etch step which also removes the thin metal seeding layer 230 in areas which are not protected by the dummy gates 250.

Next, as shown in FIG. 7, a thin oxide layer 260 is deposited on top of the entire device 1. In FIG. 8, source and drain junctions 275, 270 are implanted for both of the polysilicon gate 2 and metal gate 3 devices, respectively, including p-type and n-type LDD doping, such as ion implant indium or B or $BF_2$, with an energy level of 2 to 10 keV and a dose of $1\times10^{13}$ to $1\times10^{14}$ ions/cm$^2$.

As shown in FIG. 9, the invention forms nitride spacers 280 around the gate structures 250, 255, in the polysilicon region 2 as well as in the metal gate region 3. FIG. 10 illustrates performing deep source/drain dopings 290, 291 at a higher voltage and dosage. For example, p-type doping can be performed by implanting B or $BF_2$ with an energy level of 5 to 60 keV and a dosage of $2\times10^{15}$ to $8\times10^{15}$ ions/cm$^2$. N-type doping is achieved by substituting the above ions with either arsenic or phosphorus at an energy between of 2 keV to 100 keV. More than one block out mask may be needed to conduct different implants at different regions. After the implantation process, a rapid thermal annealing process is performed (for example, at a temperature in the range of 900° C. to 1050° C.) for a predetermined period of time in order to activate and drive in the dopants to form diffusion junction regions 290, 291. At this stage in the entire process, the polysilicon gate device 2 is considered to be finished, while the metal gate device 3 still requires the following processing.

Figure 11:
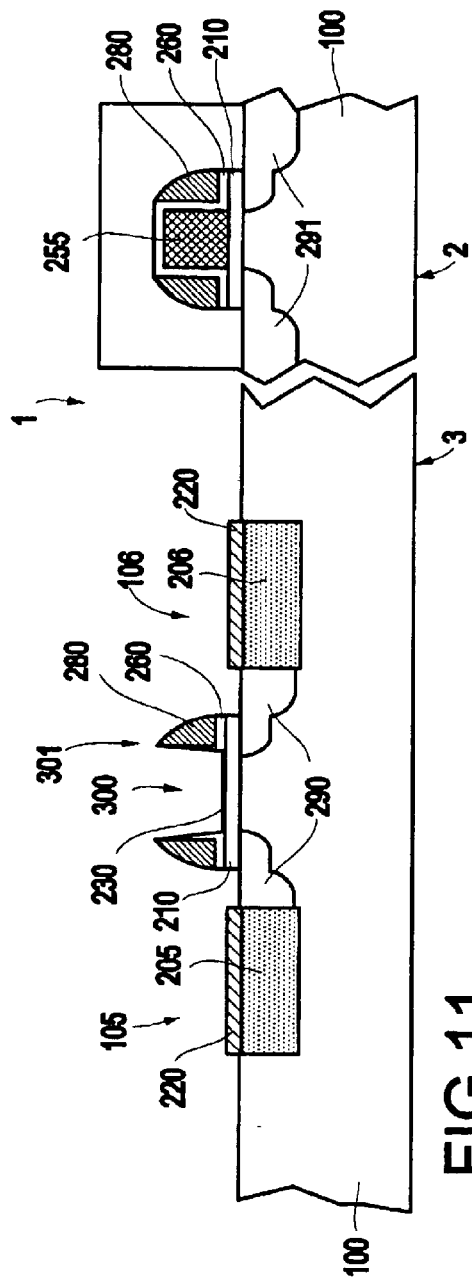
FIG. 11 is a schematic diagram of a partially completed semiconductor device.

FIG. 11 next shows using a block-out mask 305 (photoresist) to cover the finished polysilicon gate region 2. Then, a selective etch such as a CDE etch (chemical downstream etching) is used to remove all of the exposed oxide material 210, including thin oxide film 260 on top of the dummy gates 250 and the dummy gates 250 themselves. The nitride spacers 280 and the nitride layer 220 remain on top of the shallow trench regions 105, 106 are used to self-align the gate region 310 as well as protect the source and drain regions 205, 206, respectively. After etching, a void 300 remains in the gate region 301 above the seeding layer 230.

Figure 12:
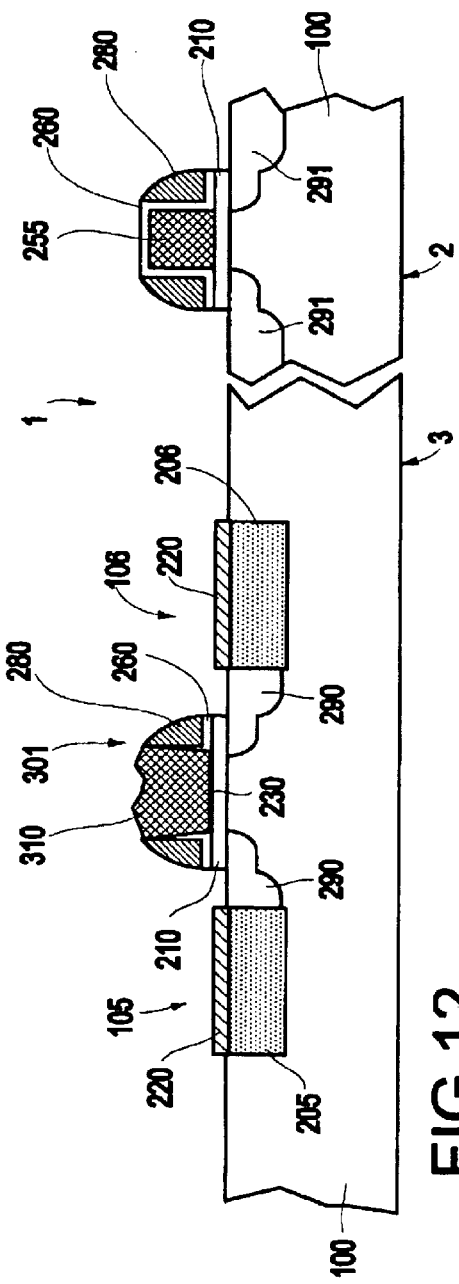
FIG. 12 is a schematic diagram of a partially completed semiconductor device.

FIG. 12 shows the structure after a selective metal plating process is carried out. More specifically, the metal seeding layer is plated such that the void 300 is filled with a metal. Thus, the metal gate is considered to be formed of pure metal (which can be a single type of metal or an alloy). For example, the metal gate material 310 comprises pure copper, gold, chromium, silver, cobalt, nickel, etc. This is advantageous compared to a structure that has a metal/polysilicon mixed gate, because pure metal gates exhibit higher performance that gates of mixed metal and polysilicon. Further, this plating process forms metal 310 only above the metal seeding layer 230 in a self-aligned process that does not require masks. The shape of the metal gate is also self-aligned by the nitride spacers 280 which permits a very narrow gate 301 to be formed. Next, the block-out mask 305 is removed. At this stage in the process, the metal gates region 3 is considered to be complete.

Figure 13:
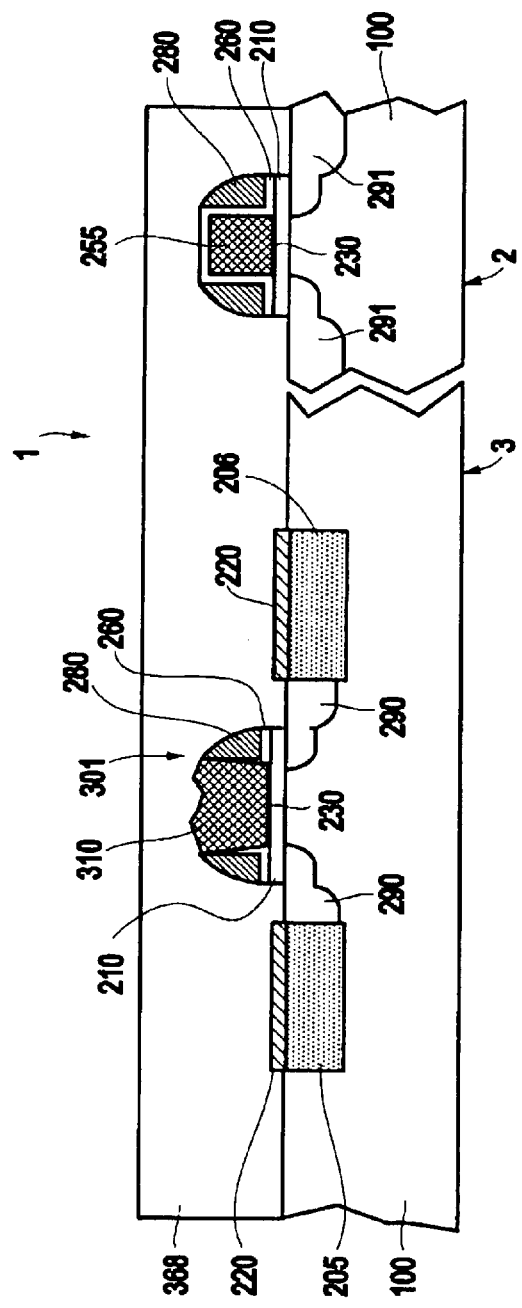
FIG. 13 is a schematic diagram of a partially completed semiconductor device.
Figure 14:
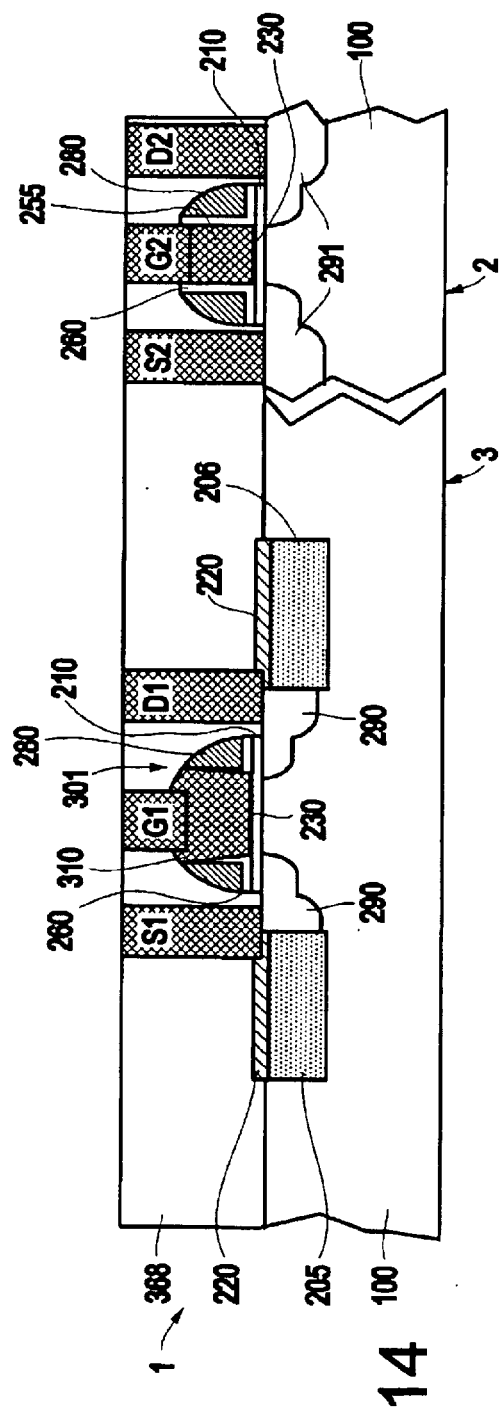
FIG. 14 is a schematic diagram of a completed semiconductor device.

Next, as illustrated in FIG. 13, a thicker insulating material 368 is formed on top of the device 1, including both the polysilicon gate structure 2 and the metal gate structure 3. FIG. 14 shows the device 1 after conventional contacts and metal interconnects are used to form contacts S2, G2, D2 and S3, G3, D3, denoted for source, gate, and drain contacts, respectively to the polysilicon gate devices 2 as well as the metal gate devices 3.

According to the present invention, both pure metal and pure polysilicon gate CMOS devices can be formed on the same semiconductor substrate. One benefit of the invention is that the dummy gate structures 250 are used during all of the high temperature processes (such as the implanting and annealing processes) that might damage metal gates. After the high temperature processing, the dummy structures 250 are removed and replaced with metal gates 301 by using a selective plating process. This saves processing steps and cost.

Figure 15:
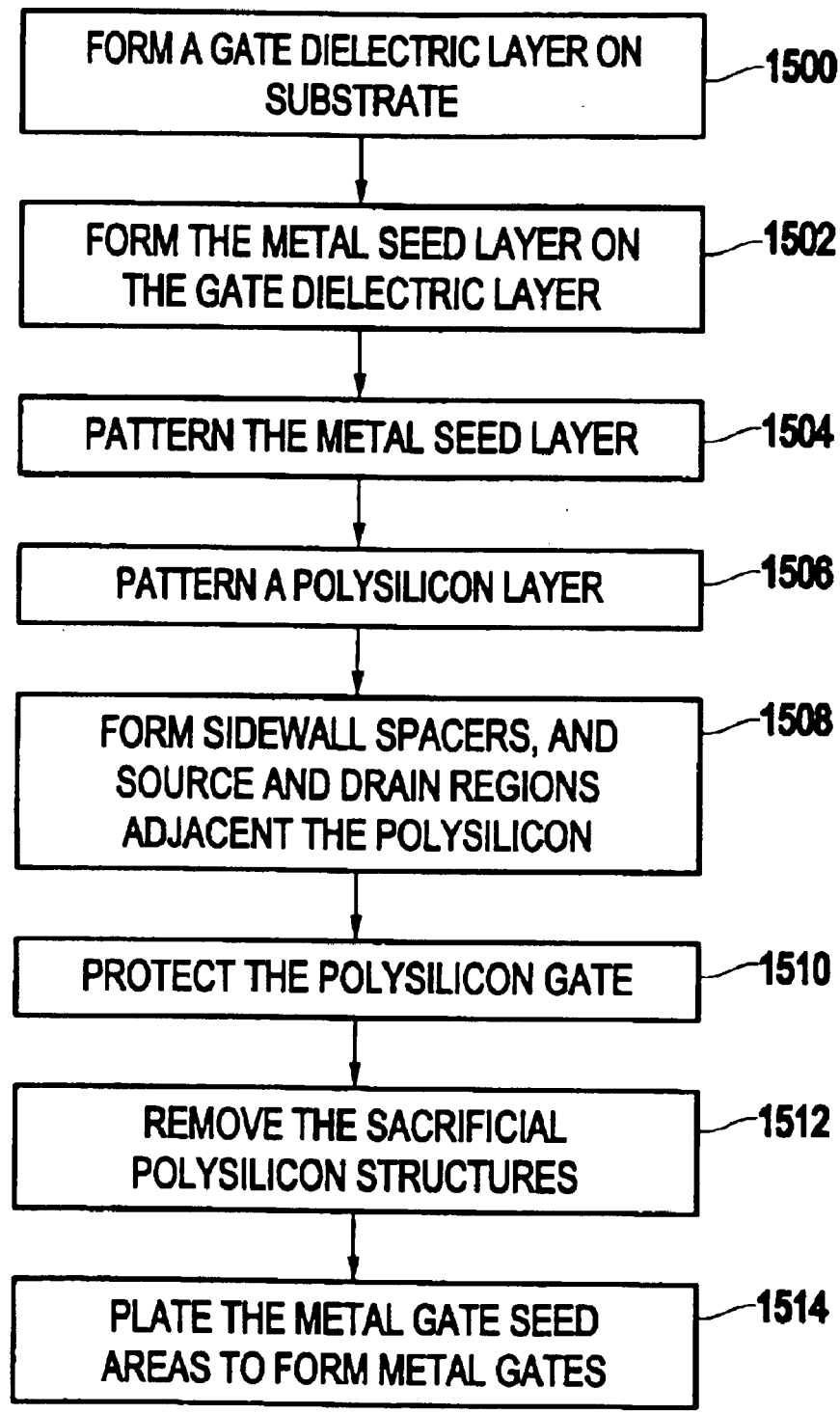
FIG. 15 is a flow diagram illustrating a preferred method of the invention.

FIG. 15 depicts a flow diagram illustrating a preferred method of the invention. More specifically, in item 1500, the invention forms a gate dielectric layer on the substrate and, in item 1502, forms the metal seed layer on the gate dielectric layer. The invention patterns the metal seed layer (1504) to leave metal seed material in metal gate seed areas above the substrate. Next, the method patterns a polysilicon layer (1506) into polysilicon structures above the substrate. Some of the polysilicon structures comprise sacrificial polysilicon structures on the metal gate seed areas and the remaining ones of the polysilicon structures comprise the polysilicon gates. The patterning of the polysilicon gates forms the sacrificial gates above all the metal gate seed areas. Following that, the invention forms sidewall spacers, and source and drain regions adjacent the polysilicon structures (1508). Then, the invention protects the polysilicon gates (1510), removes the sacrificial polysilicon structures (1512), and plates the metal gate seed areas to form the metal gates (1514). The sidewall spacers self-align the metal gates. The plating process forms the metal gates of pure metal. All thermal processing that raises the temperature above a damage threshold for the metal is performed before the plating process.

There are several benefits of the present invention. For example, the present invention provides both pure polysilicon and pure metal gate devices in a conventional, non-damascene process. By utilizing a non-damascene process, the gate dielectric can use gate insulator having a lower dielectric constant that is required for structures formed using damascene processes. The lower dielectric constant gate insulator prevents some of the high capacitance problems seen with damascene formed structures. Another benefit of the present invention is that it provides a self-aligned, high-resolution, selective metal plating technique to form a metal gate after completion of the high-temperature processing steps. This increases yield by decreasing heat related metal defects. Thus, the present invention provides one part of the chip with a reliable, high-yield pure polysilicon gate, while the other part of the chip uses the higher-performance, short channel pure metal gate.

While the invention has been described in terms of preferred embodiments, those skilled in the art will recognize that the invention can be practiced with modification within the spirit and scope of the appended claims. Specifically, while the figures illustrate a single semiconductor device, those skilled in the art will recognize such figures can be extended to any similarly designed device including complementary metal oxide semiconductor (CMOS) devices, etc.

What is claimed is:

1. A semiconductor device comprising:
    a substrate having a first region and a second region;
    a pure metal gate device in said first region;
    a polysilicon gate device in said second region;
    a first oxide film positioned along a lower portion of a sidewall of said pure metal gate device;
    a second oxide film positioned along a sidewall said polysilicon gate device;
    a first set of spacers containing said first oxide film and an upper portion of a sidewall of said pure metal gate device; and
    a second set of spacers adjacent said second oxide film.

2. The semiconductor device of claim 1, wherein said pure metal gate device comprises:
    an oxide layer above said substrate;
    a metal seed layer above said oxide layer; and
    a pure metal gate above said metal seed layer.

3. The semiconductor device of claim 2, wherein said pure metal gate comprises one of copper, gold, chromium, silver, cobalt, and nickel.

4. The semiconductor device of claim 2, wherein said metal seed layer comprises metals in the class of ruthenium.

5. The semiconductor device of claim 1, wherein said polysilicon gate device comprises:
    an oxide layer above said substrate; and
    a polysilicon gate above said oxide layer.

6. A semiconductor device comprising:
    a substrate having a first region and a second region;
    a metal gate transistor in said first region, said metal gate transistor having a pure metal gate;
    a polysilicon gate transistor in said second region, said polysilicon gate transistor having a polysilicon gate;
    a first oxide film positioned along a lower portion of a sidewall of said pure metal gate;
    a second oxide film positioned along a sidewall said polysilicon gate;
    a first set of spacers contacting said first oxide film and an upper portion of a sidewall of said pure metal gate; and
    a second set of spacers adjacent said second oxide film.

7. The semiconductor device of claim 6, wherein said metal gate transistor comprises:
    an oxide layer above said substrate;
    a metal seed layer above said oxide layer; and
    said pure metal gale above said metal seed layer.

8. The semiconductor device of claim 6, wherein said pure metal gate comprises one of copper, gold, chromium, silver, cobalt, and nickel.

9. The semiconductor device of claim 6, wherein said metal seed layer comprises metals in the class of ruthenium.

10. The semiconductor device of claim 6, wherein said polysilicon gate transistor comprises:
    an oxide layer above said substrate; and
    a polysilicon gate above said oxide layer.

11. A method of forming semiconductor devices having both metal gates and polysilicon gates on a single substrate in a single process, said method comprising:
    patterning a metal seed layer above said substrate to leave metal seed material in metal gate seed areas above said substrate;
    patterning a polysilicon layer into polysilicon structures above said substrate such that some of said polysilicon structures comprise sacrificial polysilicon structures on said metal gate seed areas and remaining ones of said polysilicon structures comprise said polysilicon gates;
    protecting said polysilicon gates;
    removing said sacrificial polysilicon structures; and
    plating said metal gate seed areas to form said metal gates.

12. The method in claim 11, further comprising:
    forming a gate dielectric layer on said substrate;
    forming said metal seed layer on said gate oxide layer; and
    forming said polysilicon layer on said gate oxide layer and said metal gate seed areas.

13. The method in claim 11, further comprising forming sidewall spacers adjacent said polysilicon structures, wherein during said plating process, said sidewall spacers self-align said metal gates.

14. The method in claim 11, wherein said patterning of said polysilicon gates forms said sacrificial gates above all said metal gate seed areas.

15. The method in claim 11, wherein said plating process forms said metal gates of pure metal.

16. The method in claim 11, further comprising performing thermal processing, wherein said thermal processing is performed before said plating process.

17. A method of forming semiconductor transistors having both metal gates and polysilicon gates on a single substrate in a single process, said method comprising:
    patterning a metal seed layer above said substrate to leave metal seed material in metal gate seed areas above said substrate;
    patterning a polysilicon layer into polysilicon structures above said substrate such that some of said polysilicon structures comprise sacrificial polysilicon structures on said metal gate seed areas and remaining ones of said polysilicon structures comprise said polysilicon gates;
    forming source and drain regions adjacent said polysilicon structures;
    protecting said polysilicon gates;
    removing said sacrificial polysilicon structures; and
    plating said metal gate seed areas to form said metal gates.

18. The method in claim 17, further comprising:
    forming a gate dielectric layer on said substrate;
    forming said metal seed layer on said gate oxide layer; and
    forming said polysilicon layer on said gate oxide layer and said metal gate seed areas.

19. The method in claim 17, further comprising forming sidewall spacers adjacent said polysilicon structures, wherein during said plating process, said sidewall spacers self-align said metal gates.

20. The method in claim 17, wherein said patterning of said polysilicon gates forms said sacrificial gates above all said metal gate seed areas.

21. The method in claim 17, wherein said plating process forms said metal gates of pure metal.

22. The method in claim 17, further comprising performing thermal processing, wherein said thermal processing is performed before said plating process.

* * * * *